United States Patent
Park et al.

(10) Patent No.: US 8,053,023 B2
(45) Date of Patent: Nov. 8, 2011

(54) CONDUCTIVE LAYER AND ORGANIC ELECTROLUMINESCENT DEVICE INCLUDING THE SAME

(75) Inventors: Jong-Jin Park, Yongin-si (KR); Tae-Woo Lee, Seoul (KR); Eun-Sil Han, Yongin-si (KR); Lyong-Sun Pu, Suwon-si (KR); Young-Kwan Lee, Suwon-si (KR); Jae-Do Nam, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 344 days.

(21) Appl. No.: 11/634,116

(22) Filed: Dec. 6, 2006

(65) Prior Publication Data

US 2007/0196643 A1 Aug. 23, 2007

(30) Foreign Application Priority Data

Feb. 20, 2006 (KR) .................. 10-2006-0016402

(51) Int. Cl.
*B05D 5/06* (2006.01)
(52) U.S. Cl. .................................... 427/64; 427/66
(58) Field of Classification Search ............... 427/66–68
See application file for complete search history.

(56) References Cited

U.S. PATENT DOCUMENTS

| | | | | |
|---|---|---|---|---|
| 4,986,886 A * | 1/1991 | Wei et al. | ...... | 205/419 |
| 5,561,030 A * | 10/1996 | Holdcroft et al. | ...... | 430/311 |
| 7,053,174 B2 * | 5/2006 | Kirchmeyer et al. | ...... | 528/377 |
| 2002/0009607 A1 * | 1/2002 | Nishimura et al. | ...... | 428/483 |
| 2005/0074603 A1 * | 4/2005 | Yuumoto et al. | ...... | 428/336 |

* cited by examiner

*Primary Examiner* — Michael Cleveland
*Assistant Examiner* — Robert Vetere
(74) *Attorney, Agent, or Firm* — Robert E. Bushnell, Esq.

(57) ABSTRACT

In a method of forming a conductive layer, a conductive layer formed using the method, an organic electroluminescent device including the conductive layer, and a method of manufacturing the organic electroluminescent device, the method of forming the conductive layer comprises: pre-treating a substrate in order to improve adhesive force; coating a mixture solution which contains a sulfonate-based catalyst and a solvent on the substrate, and then drying the coated product; and performing vapor-phase polymerization by contacting the substrate on which the catalyst is coated with monomers which make up a conductive polymer in a vapor phase. The conductive layer obtained using the method of forming a conductive layer has high conductivity, high transmittance with respect to light having a wavelength of 300 nm to 700 nm, uniform thickness, and thermal-chemical stability.

12 Claims, 3 Drawing Sheets

CONDUCTIVE LAYER AND ORGANIC ELECTROLUMINESCENT DEVICE INCLUDING THE SAME

CLAIM OF PRIORITY

This application makes reference to, incorporates the same herein, and claims all benefits accruing under 35 U.S.C. §119 from an application for CONDUCTIVE LAYER AND ORGANIC ELECTROLUMINESCENT DEVICE INCLUDING THE SAME earlier filed in the Korean Intellectual Property Office on the 20 of Feb. 2006 and there duly assigned Serial No. 10-2006-0016402.

BACKGROUND OF THE INVENTION

1. Technical Field

The present invention relates to a method of forming a conductive layer, a conductive layer formed using the method, an organic electroluminescent device including the conductive layer, and a method of manufacturing the organic electroluminescent device. More particularly, the invention relates to a method of forming a conductive layer that has high transmittance with respect to light having a wavelength of 300 nm to 700 nm and thermal-chemical stability, a conductive layer formed using the method, an organic electroluminescent device including the conductive layer, and a method of manufacturing the organic electroluminescent device.

2. Related Art

Organic light emitting devices (OLEDs) are self-emissive devices in which, when a current is provided to a fluorescent or phosphorescent organic layer, electrons and holes are combined in the organic layer, thereby emitting light. OLEDs are lightweight, and can be relatively easily manufactured using a few components. In addition, OLEDs can realize high-quality images, have wide viewing angles, and can perfectly realize moving pictures. Furthermore, OLEDs can realize high color purity and low power consumption with low operating voltage, and are therefore suitable for portable electronic devices.

OLEDs can be categorized into devices using a low molecular substance and devices using a polymer substance according to the characteristics of the material used, and the manufacturing process. In the process of manufacturing devices using a low molecular substance, vacuum deposition is used to form a layer, emission materials can be easily refined to a high degree of purity, and a color pixel can be easily obtained. However, there are several problems in the practical use of a low molecular substance in devices. For example, quantum efficiency should be improved, crystallization of a layer should be prevented, and color purity should be improved.

Meanwhile, studies on light emitting devices using polymer molecules are being carried out after a Cambridge group in 1990 reported that, when electricity was applied to poly (1,4-phenylenevinylene) (PPV), that is, a π-conjugated polymer, light was emitted. The π-conjugated polymers have a chemical structure in which single bonds (or s-bonds) and double bonds (or π-bonds) are alternated so that π-electrons are not polarized and move relatively easily along the bonding chain. Due to such a semi-conductive property of π-conjugated polymers, the entire range of visible light corresponding to a HOMO-LUMO band-gap can be easily obtained through appropriate molecular design when the π-conjugated polymers are used in an emission layer of an organic electroluminescent device. In addition, a layer can be easily formed by spin coating or printing, and thus, the manufacturing process is simple and inexpensive. Furthermore, the layer formed has excellent mechanical properties because the polymer molecules have a high glass transition temperature. Accordingly, in the long term, it is expected that polymer light emitting devices will have a commercial competitive edge over low molecular light emitting devices.

Generally, these polymer light emitting devices include, as an organic layer, a multi-layer which includes a hole injection layer formed using a conductive polymer, an emission layer, and an electron injection layer, instead of a single emission layer, to improve efficiency and decrease operating voltage. Such a multi-organic layer can be basically divided into a hole related layer, an electron related layer, and an emission layer.

A hole injection layer (HIL) is generally formed by spin coating a PEDOT[poly(3,4-ethylene dioxythiophene)]-PSS [poly(4-styrenesulfonate)] aqueous solution (Model: Baytron-P, commercially available from Bayer AG Inc) on an indium tin oxide (ITO) electrode in the process of manufacturing an organic light emitting device.

However, a conductive layer which is formed through conventional wet polymerization of monomers that make up a conductive polymer has low transmittance and low conductivity due to the presence of impurities generated during a process of preparing a polymer solution.

Accordingly, there is a need to develop a uniformly conductive, transparent layer in order to obtain an OLED having high efficiency and a long lifetime.

SUMMARY OF THE INVENTION

The present invention provides a method of forming a conductive layer which has high conductivity, high transmittance with respect to light having a wavelength of 300 nm to 700 nm, uniform thickness, and thermal-chemical stability, a conductive layer formed using the method, an organic electroluminescent device including the conductive layer, and a method of manufacturing the organic electroluminescent device.

According to an aspect of the present invention, a method of forming a conductive layer comprises the steps of: pretreating a substrate to improve an adhesive force; coating a mixture solution which contains a sulfonate-based catalyst and a solvent on the substrate, and then drying the coated product; and performing vapor-phase polymerization by contacting the substrate on which the catalyst is coated with monomers that make up a conductive polymer in a vapor phase.

According to another aspect of the present invention, a conductive layer formed using the method of forming a conductive layer is provided.

According to another aspect of the present invention, in an organic electroluminescent device, at least one layer selected from the group consisting of an anode, a hole injection layer, a hole transfer layer, an electron transfer layer, an electron injection layer, and a cathode comprises the conductive layer.

According to another aspect of the present invention, a method of manufacturing an organic electroluminescent device comprises the steps of: forming an anode on a substrate; forming a hole injection layer on the anode; forming a hole transfer layer on the hole injection layer; forming an emission layer on the hole transfer layer; and forming a cathode on the emission layer; wherein at least one layer selected from the group consisting of the anode, the hole injection layer, the hole transfer layer, and the cathode comprises the conductive layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
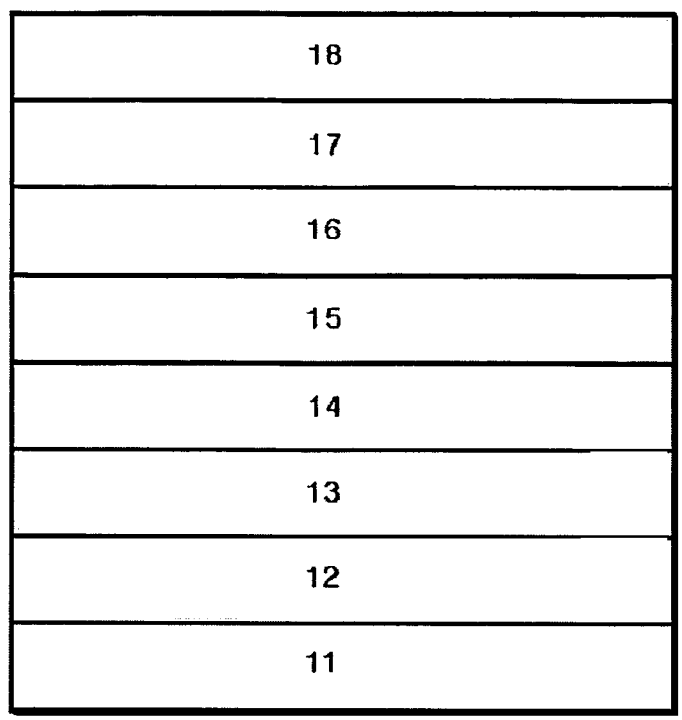
FIG. 1 is a cross-sectional view of an organic electroluminescent device.

FIG. 1 is a cross-sectional view of an organic electroluminescent device including a low molecular emission layer.

Referring to FIG. 1, a positive electrode or anode 12 is deposited on a substrate 11; a hole injection layer (HIL) 13 and a hole transfer layer (HTL) 14, which are related to holes, are deposited on the anode 12; an electron emission layer (EML) 15 is deposited on the HTL 14; an electron transfer layer (ETL) 16 and an electron injection layer (EIL) 17, which are related to electrons, are deposited on the EML 15; and a negative electrode or cathode 18 is deposited on the EIL 17.

The present invention relates to a method of forming a conductive layer, a conductive layer formed using the method, an organic electroluminescent device including the conductive layer, and a method of manufacturing the organic electroluminescent device. In particular, the present invention relates to a method of forming a conductive layer which has high transmittance with respect to light having a wavelength of 300 nm to 700 nm and thermal-chemical stability, a conductive layer formed using the method, an organic electroluminescent device including the conductive layer, and a method of manufacturing the organic electroluminescent device.

A method of forming a conductive layer according to an embodiment of the present invention comprises the steps of: pre-treating a substrate to improve an adhesive force; coating a mixture solution which contains a sulfonate-based catalyst and a solvent on the substrate, and then drying the coated product; and performing vapor-phase polymerization by contacting the substrate on which the catalyst is coated with monomers which make up a conductive polymer in a vapor phase.

In the pre-treating process, impurities on the substrate are removed so that the surface of the substrate becomes clean and is thus activated. As a result, the adhesive force of conductive polymer monomers with respect to the substrate is increased so as to effectively perform vapor-phase polymerization on the substrate.

The pre-treating process may include at least one treatment selected from the group consisting of a cleansing treatment using a solvent, a plasma treatment, an ultraviolet irradiation treatment, and an amine treatment.

The cleansing treatment with a solvent can be a process of removing oil from an oily substrate, or a process of removing impurities from the surface of a substrate which will be coated. At this point, the solvent can be any solvent which is commonly used. For example, the solvent can be acetone, isopropyl alcohol, ethanol, or the like.

In the plasma treatment, plasma refers to the state of a discharged gaseous mixture of an electron, an anion, a cation, and an excited atom or molecule, formed by separating electrons from or combining electrons with vaporous atoms or molecules. Plasma is divided into thermal or equilibrium plasma and cold or non-equilibrium plasma. The plasma treatment is performed in order to form an oxide layer on the surface of the substrate so that the substrate is activated. As a result, a conductive layer can be effectively formed on the substrate.

The ultraviolet irradiation treatment is performed by exposing the substrate to a mixture with a halogen gas or oxygen which has been exposed to ultraviolet (UV) rays. For example, there is a UV-ozone oxidizing technique in which ozone is activated by being exposed to UV so as to obtain a very strong oxidizing capability, and such ozone is used to remove impurities on a substrate.

The amine treatment refers to a method of coating an amine compound on the substrate by impregnation (self-assembly layer coating method), spinning, spraying, printing, or chemical vapor deposition (CVD). At this point, the amine compound can be N,N-isopropylethylamine, ethylamine, dimethylamine, diethylamine, triethylamine, dipropylamine, or the like, and preferably N,N-isopropylethylamine or triethylamine. Since the amine compound has high water solubility, the amine treatment is performed under a relative humidity of 25% or less, or under a nitrogen atmosphere, to maintain the reactivity of the amine compound with respect to the cleaned substrate constant.

The substrate may be formed of a material selected from glass, polyethylene telephthalate(PET), polyethylenenaphthalate(PEN), polyethersulfone(PES), polyimide, polypropylene, cellopane, polyvinylchloride(PVC), metal, and stainless or aluminum covered with a 1 to 100 micron-thick metal film.

The sulfonate-based catalyst may be represented by formula 1:

$$MX \qquad (1)$$

where M is selected from the group consisting of Fe, Mg, Mn, Co, Ni, and Zn; and X is selected from the group consisting of p-toluenesulfonate, dodecylbenzenesulfonate, 2-acrylamido-2-methyl-1-propanesulfonate, 4-morpholinepropanesulfonate, 4-pyridineethanesulfonate, and 3-pyridinesulfonate.

The solvent may include at least one alcohol selected from n-butanol, isopropanol, ethanol, and methanol, or a mixture thereof. However, the solvent is not limited thereto.

The concentration of the sulfonate-based catalyst contained in the mixture solution may be 0.1 to 10 mole, and preferably 1 to 5 mole, based on 1 liter of the solvent. When the concentration of the sulfonate-based catalyst is outside this range, polymerization efficiency may be reduced.

The mixture solution may be coated on the substrate to a thickness of 1 to 100 nm, and preferably 20 to 40 nm.

Then, the resultant substrate, which is coated with the mixture solution, is dried in an oven at a temperature of 50 to 100° C. for 1 to 3 minutes.

The conductive polymer monomer may include at least one material selected from 3,4-ethylenedioxythiophene (EDOT), thiophene, aniline, pyrrol, vinylcarbazole, and a derivative of these. However, the conductive polymer monomer is not limited thereto.

The mole ratio of the conductive polymer monomers to the sulfonate-based catalyst may be in the range of 1:10 to 1:50, and preferably 1:20 to 1:30. When the mole ratio of the conductive polymer monomers to the sulfonate-based catalyst is outside this range, the polymerization efficiency may be reduced.

The mixture solution may further include an oxidant.

The oxidant may be, but is not limited to, $AuCl_3$, $MgCl_2$, $H_2PtCl_6 \cdot 6H_2O$, $(HAuCl_4 \cdot H_2O)AgNO_3$, $Na_2PdCl_4$, $NiCl_2$, $FeCl_3$, or $CuCl_2$, and preferably $AuCl_3$, $MgCl_2$.

A metal cation of the oxidant is reduced in order to precipitate in the form of metal while oxidizing conductive polymer monomers so that conductive polymer monomers are cationized and polymerization is performed. The precipitated metal forms nano particles together with a conductive polymer, thereby improving conductivity of the conductive layer obtained.

At this point, the concentration of the oxidant of the mixture solution may be in the range of 0.1 to 30 mole, and preferably 1 to 15 mole, based on 1 liter of the solvent. When the concentration of the oxidant is less than 0.1 mole, the polymerization efficiency may be reduced. On the other hand, when the concentration of the oxidant is more than 30 mole, the solubility of the oxidant may be reduced.

The mole ratio of the conductive polymer monomers to the oxidant may be in the range of 1:5 to 1:30, and preferably 1:10 to 1:20. When the mole ratio of the conductive polymer monomers to the oxidant is less than 1:5, the polymerization efficiency may be reduced. On the other hand, when the mole ratio of the conductive polymer monomers to the oxidant is more than 1:30, unreacted oxidant may precipitate.

In the vapor-phase polymerization, the substrate which is coated with the mixture solution containing a catalyst is contacted with gaseous conductive polymer monomers prepared by vaporizing conductive polymer monomers, as described above, in order for polymerization to occur at the surface of the substrate.

The conductive polymer monomers can be vaporized in a closed chamber at 70 to 100° C., or using a CVD apparatus. However, the method of vaporizing conductive polymer monomers is not limited thereto.

The temperature for vapor-phase polymerization may be in the range of 50 to 100° C., and preferably 65 to 95° C. When the temperature for vapor-phase polymerization is less than 65° C., vaporization may not occur well. On the other hand, when temperature for vapor-phase polymerization is higher than 100° C., monomers for the vapor-phase polymerization may be unstable.

When the vapor-phase polymerization is completed, unreacted monomers or the like are removed by a cleansing process. At this point, an alcohol-based solvent is generally used. However, when needed, the cleansing process can be performed with water.

A method of forming a conductive layer according to an embodiment of the present invention comprises the steps of: pre-treating a substrate in order to improve an adhesive force; coating a mixture solution which contains a sulfonate-based catalyst and a solvent on the substrate, and then drying the coated product; and performing vapor-phase polymerization by contacting the substrate on which the catalyst is coated with monomers that make up a conductive polymer in a vapor phase.

The conductive layer contains nano composite particles which contain a conductive polymer obtained by vapor-phase polymerization and metal which acts as an oxidant during polymerization.

The conductive layer preferably has an electrical conductivity of 0.01 S/cm to 1,000 S/cm. The conductive layer having such a range of conductivity can be used to form a transparent electrode, an interlayer of an organic electroluminescent device, electronic components, such as electronic circuits, printed circuit boards, as conductive or semiconductor polymer, and an electromagnetic protective layer, and can be used for anti-static coating.

An organic electroluminescent device according to an embodiment of the present invention includes the conductive layer.

The organic electroluminescent device according to an embodiment of the present invention can include a polymer emission layer or a low molecular emission layer.

According to an embodiment of the present invention, the organic electroluminescent device comprises an anode formed on a substrate, a hole injection layer formed on the anode, a hole transfer layer formed on the hole injection layer, an emission layer formed on the hole transfer layer, an electron transfer layer formed on the emission layer, an electron injection layer formed on the charge transfer layer, and a cathode formed on the charge injection layer.

In the organic electroluminescent device according to an embodiment of the present invention, at least one layer selected from the anode, the hole injection layer, the hole transfer layer, the electron transfer layer, the electron injection layer, and the cathode includes the conductive layer.

In the organic electroluminescent device according to an embodiment of the present invention, the substrate can be any substrate which can be used in an organic electroluminescent device. For example, the substrate can be a glass substrate or a transparent plastic substrate, both of which are transparent and waterproof, have smooth surfaces, and can be easily handled.

In the present embodiment, when the organic electroluminescent device has a top emission structure, the anode formed on the substrate can be formed of a reflective metal layer. On the other hand, when the organic electroluminescent device has a bottom emission structure, the anode formed on the substrate can be formed of a transparent, conductive material, such as indium tin oxide (ITO), indium zinc oxide (IZO), tin oxide ($SnO_2$), zinc oxide (ZnO), or a mixture thereof.

The thickness of the hole injection layer is preferably in the range of 300 to 1000 Å. When the thickness of the hole injection layer is less than 300 Å, hole injection properties may be reduced. On the other hand, when the thickness of the hole injection layer is more than 1000 Å, the operating voltage of the device may increase.

The thickness of the hole transfer layer is preferably in the range of 300 to 1000 Å. When the thickness of the hole transfer layer is less than 300 Å, hole transferring properties may be reduced. On the other hand, when the thickness of the hole transfer layer is more than 1000 Å, the operating voltage may increase.

In the polymer organic electroluminescent device, according to an embodiment of the present invention, the emission layer is preferably formed of a phosphorous or fluorescent material.

In addition, an electron injection layer (EIL) can be selectively deposited on the emission layer. The material which is used to form the EIL is not limited, and can be LiF, Li, Ba, $BaF_2$/Ca, or the like.

Then, if the organic electroluminescent device does not include the EIL, a cathode is deposited on the emission layer, or, if the organic electroluminescent device includes an electron transfer layer, a cathode is deposited on the electron injection layer.

In the organic electroluminescent device including the low molecular emission layer, the thickness of the hole injection layer is preferably in the range of 50 to 1500 Å. When the thickness of the hole injection layer is less than 50 Å, hole injection properties may be reduced. On the other hand, when the thickness of the hole injection layer is more than 1500 Å, the operating voltage of the device may increase.

The thickness of the hole transfer layer is preferably in the range of 50 to 1500 Å. When the thickness of the hole transfer layer is less than 50 Å, hole transferring properties may be reduced. On the other hand, when the thickness of the hole transfer layer is more than 1500 Å, the operating voltage may increase.

In the organic electroluminescent device including a low molecular emission layer, a red emission material, a green emission material, and a blue emission material are respectively patterned in R, G, and B regions in the hole injection layer, and in a hole transfer layer, thereby forming an emission layer which forms a pixel region. The respective emission materials can include at least two host materials which are mixed.

The thickness of the emission layer is in the range of 100 to 800 Å, and preferably 300 to 400 Å. When the thickness of the emission layer is less than 100Å, the efficiency and lifetime of the emission layer are reduced. On the other hand, when the thickness of the emission layer is more than 800 Å, the operating voltage may increase.

In the organic electroluminescent device including a low molecular emission layer, an electron transfer layer (ETL) is formed on an emission layer. The material which is used to form the electron transfer layer can be any material commonly used to form an electron transfer layer. For example, such a material can be $Alq_3$. The thickness of the electron transfer layer is preferably in the range of 50 to 600 Å. When the thickness of the electron transfer layer is less than 50 Å, the lifetime of the device may be reduced. On the other hand, when the thickness of the electron transfer layer is more than 600 Å, the operating voltage of the device may increase.

An electron injection layer (EIL) can be selectively formed on the electron transfer layer. The material which is used to form the electron injection layer is not limited, and can be LiF, NaCl, CsF, $Li_2O$, BaO, Liq, or the like. The thickness of the electron injection layer is preferably in the range of 1 to 100 Å. When the thickness of the electron injection layer is less than 1 Å, an injection of electrons may be difficult to perform, and thus the operating voltage of the device may increase. On the other hand, when the thickness of the electron injection layer is more than 100 Å, the electron injection layer may act as an insulating layer, and thus the operating voltage of the device may increase.

Then, a cathode metal which is a second electrode is deposited on the electron transfer layer. The cathode metal can be Li, Mg, Al, Al—Li, Ca, Mg—In, Mg—Ag, or the like.

A method of manufacturing an organic electroluminescent device according to an embodiment of the present invention comprises the steps of: forming an anode on a substrate; forming a hole injection layer on the anode; forming a hole transfer layer on the hole injection layer; forming an emission layer on the hole transfer layer; and forming a cathode on the emission layer; wherein at least one layer selected from the group consisting of the anode, the hole injection layer, the hole transfer layer, and the cathode comprises the conductive layer.

First, an anode material which is a first electrode is coated on a substrate. At this point, an insulating layer (PDL) which defines a pixel region is formed on the anode.

Then, a hole injection layer is deposited as an organic layer on the entire substrate using a method such as vacuum thermal deposition or spin coating.

Subsequently, a hole transfer layer is selectively deposited on the hole injection layer by vacuum thermal deposition or spin coating. Then, an emission layer is deposited on the hole injection layer if the hole transfer layer has not been formed, or on the hole transfer layer if the hole transfer layer has been formed. The method of forming the emission layer is not limited to the method described above, and can be vacuum deposition, inkjet printing, laser transferring, photolithographing, or the like.

An electron transfer layer (ETL), which is not used in an organic electroluminescent device including a polymer emission layer, and an electron injection layer (EIL) are selectively deposited on the emission layer by vacuum deposition or spin coating. Then, the cathode metal which is a second electrode is deposited over the entire substrate by vacuum thermal deposition, and is then encapsulated.

The present invention will be described in further detail with reference to the following examples. These examples are for illustrative purposes only, and are not intended to limit the scope of the present invention.

EXAMPLE 1

In order to prepare a substrate, a polyethylenetelephthalate film substrate having a thickness of 100 microns was cut to a size of 50 mm×50 mm, and was then pre-treated with 40 vol % of ethylene amine at 40° C. for 24 hours.

A butanol solution (10 wt %) of Fe(III)-toluene sulfonate, in which 3 mole of Fe(III)-toluene sulfonate based on 1 liter of butanol was dissolved, was prepared and then spin coated on the polyethylenetelephthalate film substrate which had been pre-treated and dried in an oven at a temperature of 100° C. for 0.5 hours to remove the butanol which was used.

Then, the substrate which had been coated with the catalyst was reacted with EDOT (3,4-ethylenedioxythiophene) monomer for about 20-30 seconds in a CVD chamber designed so that saturated EDOT (3,4-ethylenedioxythiophene) monomers were generated. At this point, the mole ratio of 3,4-ethylenedioxythiophene (EDOT) monomers to Fe(III)-toluene sulfonate was 1:15. Then, the reacted substrate was cleansed with a methanol solvent to remove unreacted reactants. At this point, the temperature of the reaction chamber was 75° C. As a result, a transparent brown conductive polymer layer of 3,4-ethylenedioxythiophene (PEDOT) was obtained.

EXAMPLE 2

A conductive polymer layer of EDOT (3,4-ethylenedioxythiophene) monomer was prepared in the same manner as in Example 1, except that 12 wt % of a butanol solution of Fe(III)-toluene sulfonate, in which 2 mole of Fe(III)-toluene sulfonate based on 1 liter of butanol was dissolved, was prepared, and the mole ratio of a 3,4-ethylenedioxythiophene (EDOT) monomer to Fe(III)-toluene sulfonate was 1:10.

EXAMPLE 3

A conductive polymer layer of EDOT (3,4-ethylenedioxythiophene) monomer was prepared in the same manner as in Example 1, except that 20 wt % of a butanol solution of Fe(III)-toluene sulfonate, in which 5 mole of Fe(III)-toluene sulfonate based on 1 liter of butanol was dissolved, was prepared, and the mole ratio of a 3,4-ethylenedioxythiophene (EDOT) monomer to Fe(III)-toluene sulfonate was 1:15.

EXAMPLE 4

A conductive polymer layer of EDOT (3,4-ethylenedioxythiophene) monomer was prepared in the same manner as in Example 1, except that a mixture solution, in which 5 mole of Fe(III)-toluene sulfonate and 5 mole of $AuCl_3$ based on 1 liter of butanol were dissolved, was prepared, the mole ratio of 3,4-ethylenedioxythiophene (EDOT) monomer to Fe(III)-toluene sulfonate was 1:10, and the mole ratio of 3,4-ethylenedioxythiophene (EDOT) monomer to $AuCl_3$ was 1:5.

Figure 2:
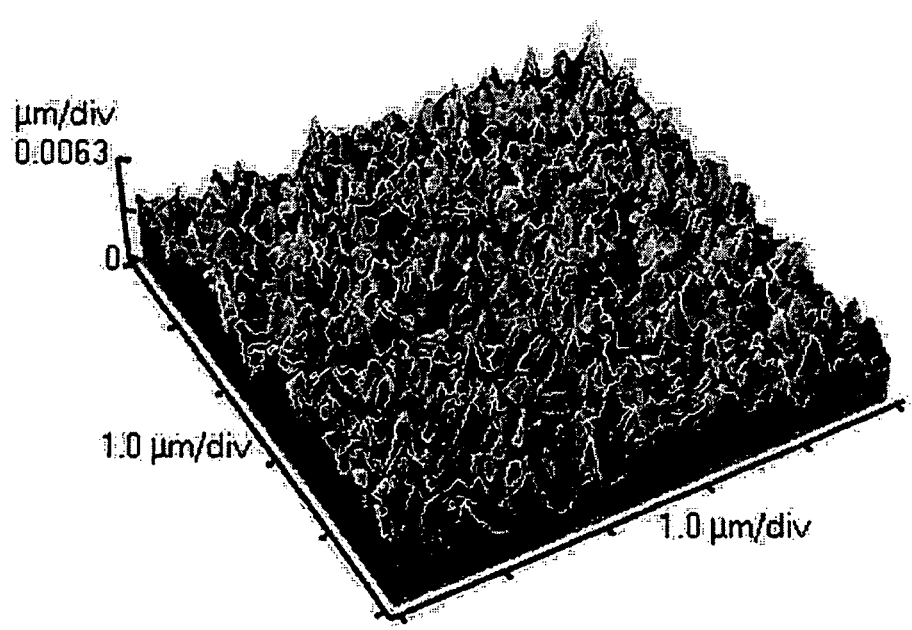
FIG. 2 is an atomic force microscope (AFM) image of the surface of the conductive layer prepared according to Example 4 (set forth below)

An atomic force microscope (AFM) image of the surface of the conductive layer prepared is shown in FIG. 2, which is an atomic force microscope (AFM) image of the surface of the conductive layer prepared according to Example 4.

Figure 3:
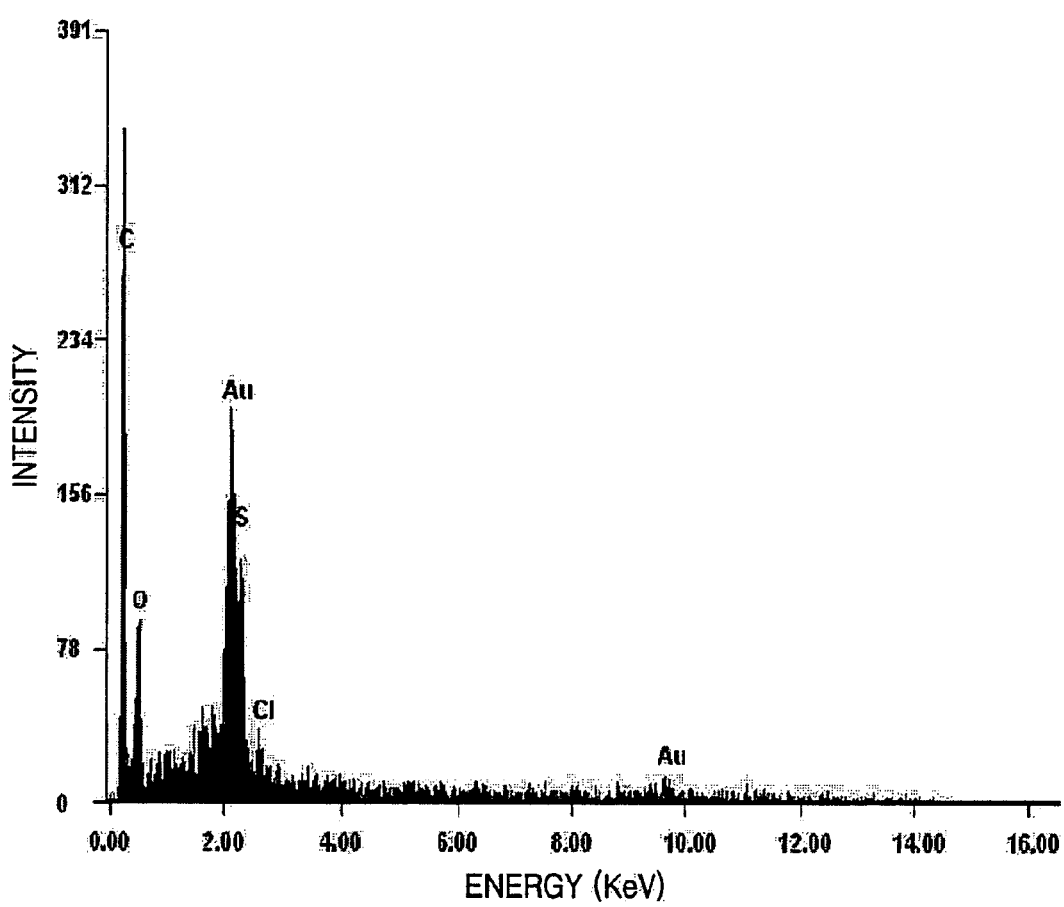
FIG. 3 shows an energy dispersive X-ray (EDX) spectrum of the surface of the conductive layer prepared according to Example 4 (set forth below)

In addition, the presence of Au metal in the form of $AuCl_3$ which was used as an oxidant was identified using an energy dispersive X-ray (EDX) spectrometer which is a surface component analysis apparatus. The results are shown in FIG. 3, which shows an energy dispersive X-ray (EDX) spectrum of the surface of the conductive layer prepared according to Example 4.

COMPARATIVE EXAMPLE 1

In order to prepare a substrate, a polyethylenetelephthalate film substrate having a thickness of 100 microns was cut to a size of 50 mm×50 mm, and was then pre-treated with 40 vol % of ethylene amine at 40° C. for 24 hours.

A butanol solution (10 wt %) of $FeCl_3$, in which 3 mole of $FeCl_3$ based on 1 liter of butanol was dissolved, was prepared, and was then spin coated on the polyethylenetelephthalate film substrate which had been pre-treated and dried in an oven at a temperature of 100° C. for 0.5 hours to remove the butanol which was used.

Then, the substrate which had been coated with the catalyst was reacted with EDOT (3,4-ethylenedioxythiophene) monomer for about 20-30 seconds in a CVD chamber designed so that saturated EDOT (3,4-ethylenedioxythiophene) monomers were generated. At this point, the mole ratio of EDOT (3,4-ethylenedioxythiophene) monomer to $FeCl_3$ was 1:15. Then, the reacted substrate was cleansed with a methanol solvent to remove unreacted reactants. At this point, the temperature of the reaction chamber was 75° C. As a result, a transparent brown conductive polymer layer of EDOT (3,4-ethylenedioxythiophene) monomer was obtained.

COMPARATIVE EXAMPLE 2

A conductive polymer layer of EDOT (3,4-ethylenedioxythiophene) monomers was prepared in the same manner as in Comparative Example 1, except that 5 mole of $FeCl_3$ based on 1 liter of butanol was used.

Thickness, surface resistance, conductivity, and transmittance of the conductive layers prepared according to Examples 1 thru 4, and Comparative Examples 1 and 2 were measured. The results are shown in Table 1.

Properties of Conductive Layers (1) Thickness

Thickness was measured by scanning the surface of the sample using a TENCOR 200 probe.

(2) Conductivity

Conductivity was measured using a JANDEL 4-point probe.

(3) Transmittance

Transmittance was measured in a film state using a UV spectrometer.

TABLE 1

|  | Thickness (Å) | Conductivity (S/cm) | Transmittance (%) |
| --- | --- | --- | --- |
| Example 1 | 4000 | 192 | 81 |
| Example 2 | 4000 | 160 | 85 |
| Example 3 | 7200 | 174 | 83 |
| Example 4 | 4200 | 985 | 85 |
| Comparative Example 1 | 4000 | 32 | 72 |
| Comparative Example 2 | 7000 | 68 | 60 |

As shown in Table 1, the conductive layers obtained according to Examples 1 thru 4 had better conductivity and better transmittance than the conductive layers obtained according to Comparative Examples 1 and 2.

EXAMPLE 5

The conductive layer prepared according to Example 1 was used as a hole injection layer, and then poly (9,9-dioctylfluorene-co-bis-(4-butylphenyl-bis-N,N-phenyl-1, 4-phenylenediamine) (PFB) was spin coated on the hole injection layer to a thickness of 20 nm to form a hole transfer layer. Subsequently, TS-9, which is polyfluorene-based emission material, was spin coated on the hole transfer layer to a thickness of 70-80 nm to form an emission layer.

Then, as a cathode, $BaF_2$ and Ca were sequentially vacuum deposited on the emission layer to thicknesses of 5 nm and 3.3 nm, respectively, and then Al was vacuum deposited to a thickness of 250 nm. As a result, an organic electroluminescent device according to the present invention was manufactured.

COMPARATIVE EXAMPLE 3

An organic electroluminescent device was manufactured in the same manner as in Example 5, except that the conductive layer prepared according to Comparative Example 1 was used as a hole injection layer.

Performance Test of Organic Electroluminescent Device

Figure 4:
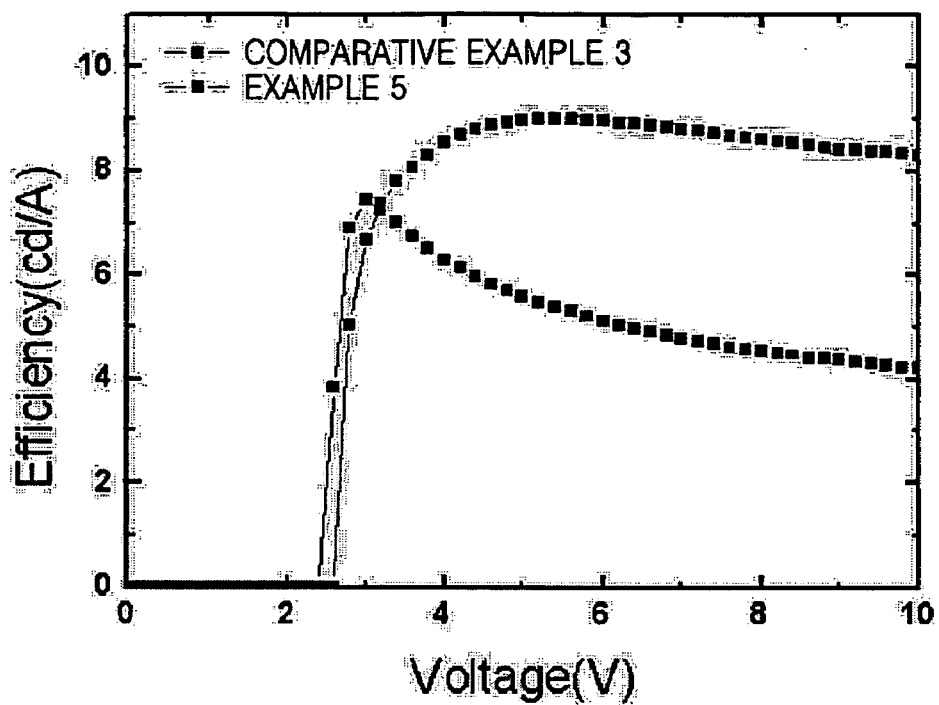
FIG. 4 is a graph of efficiency with respect to voltage of the organic electroluminescent devices manufactured according to Example 5 (set forth below) and Comparative Example 3 (set forth below)
Figure 5:
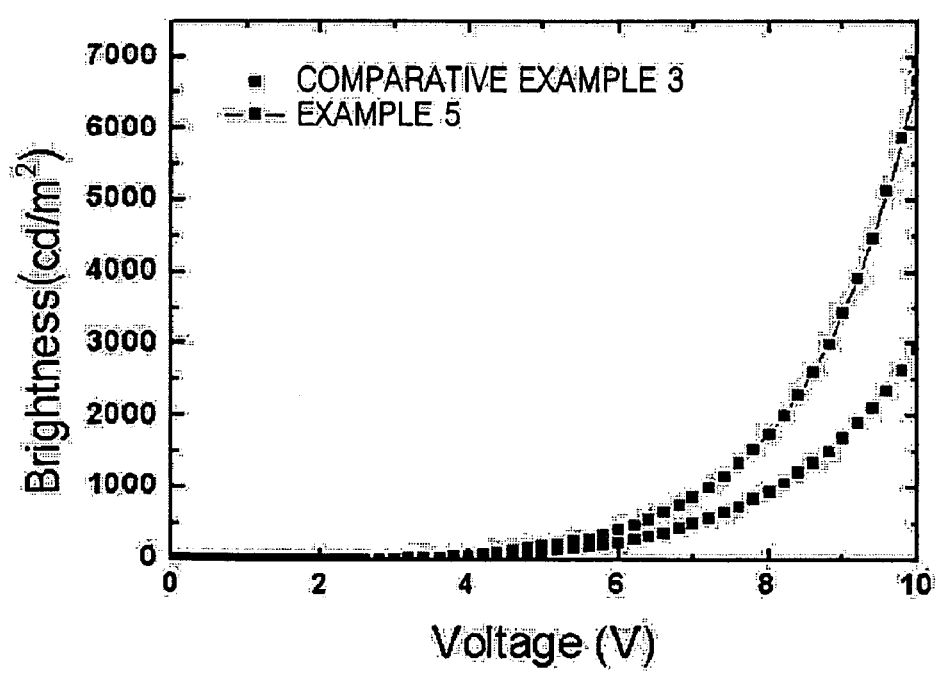
FIG. 5 is a graph of brightness with respect to voltage of the organic electroluminescent devices manufactured according to Example 5 (set forth below) and Comparative Example 3 (set forth below).

FIG. 4 is a graph of efficiency with respect to voltage of the organic electroluminescent devices manufactured according to Example 5 and Comparative Example 3, and FIG. 5 is a graph of brightness with respect to voltage of the organic electroluminescent devices manufactured according to Example 5 and Comparative Example 3

Referring to FIGS. 4 and 5, organic electroluminescent devices including the conductive layer according to the present invention show better brightness than conventional organic electroluminescent devices.

The conductive layer according to the present invention has high conductivity, high tranmittance with respect to light having a wavelength of 300 nm to 700 nm, uniform thickness, and thermal/chemical stability.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of forming a conductive layer, comprising the steps of:
pre-treating a substrate to improve an adhesive force;
coating the substrate with a mixture solution which contains a sulfonate-based catalyst and a solvent to produce a coated product, and then drying the coated product, the mixture solution further containing an oxidant including a material selected from a group consisting of $AuCl_3$, $MgCl_2$, $H_2PtCl_6 \cdot 6H_2O$, $(HAuCl_4 \cdot H_2O)AgNO_3$, $Na_2PdCl_4$, and $NiCl_2$; and
performing vapor-phase polymerization by contacting the substrate with monomers that make up a conductive polymer in a vapor phase.

2. The method of claim 1, wherein the pre-treating step comprises performing at least one treatment selected from a group consisting of a cleaning treatment using a solvent, a plasma treatment, an ultraviolet ray irradiation treatment, and an amine vapor-phase treatment.

3. The method of claim 1, wherein the substrate is formed of a material selected from a group consisting of glass, polyethylene telephthalate(PET), polyethylenenaphthalate (PEN), polyethersulfone(PES), polyimide, polypropylene, cellopane, polyvinylchloride(PVC), metal, and one of stainless steel and aluminum covered with a metal film having a thickness in a range of 1 to 100 microns.

4. The method of claim 1, wherein the sulfonate-based catalyst is represented by formula 1:

$$MX \qquad (1)$$

where M is selected from a group consisting of Fe, Mg, Mn, Co, Ni, and Zn; and
X is selected from a group consisting of p-toluenesulfonate, dodecylbenzenesulfonate, 2-acrylamido-2-methyl-1-propanesulfonate, 4-morpholinepropanesulfonate, 4-pyridineethanesulfonate, and 3-pyridinesulfonate.

5. The method of claim 1, wherein the solvent comprises at least one alcohol selected from a group consisting of n-butanol, isopropanol, ethanol, methanol, and a mixture thereof.

6. The method of claim 1, wherein the mixture solution includes the sulfonate-based catalyst in a range of 0.1 to 10 mole based on 1 liter of the solvent.

7. The method of claim 1, wherein the conductive polymer comprises at least one material selected from a group consisting of EDOT (3,4-ethylenedioxythiophene) monomer, thiophene, aniline, pyrrol, vinylcarbazole, and a derivative thereof.

8. The method of claim 1, wherein a mole ratio of the conductive polymer to the sulfonate-based catalyst is in a range of 1:5 to 1:30.

9. The method of claim 1, wherein the mixture solution includes the sulfonate-based catalyst in a range of 0.1 to 30 mole based on 1 liter of the solvent.

10. The method of claim 1, wherein a mole ratio of the conductive polymer to the oxidant is in a range of 1:10 to 1:20.

11. A method of manufacturing an organic electroluminescent device, comprising the steps of:
forming an anode on a substrate;
forming a hole injection layer on the anode;
forming a hole transfer layer on the hole injection layer;
forming an emission layer on the hole transfer layer; and
forming a cathode on the emission layer;
wherein at least one of the anode, the hole injection layer, the hole transfer layer, and the cathode comprises a conductive layer, a method of forming the conductive layer comprising:
pre-treating a substrate to improve an adhesive force;
coating the substrate with a mixture solution which contains a sulfonate-based catalyst and a solvent to produce a coated product, and then drying the coated product, the mixture solution further containing an oxidant including a material selected from a group consisting of $AuCl_3$, $MgCl_2$, $H_2PtCl_6 \cdot 6H_2O$, $(HAuCl_4 \cdot H_2O)AgNO_3$, $Na_2PdCl_4$, and $NiCl_2$; and
performing vapor-phase polymerization by contacting the substrate with monomers that make up a conductive polymer in a vapor phase.

12. A method of forming a conductive layer, comprising the steps of:
pre-treating a substrate to improve an adhesive force;
coating the substrate with a mixture solution which contains a sulfonate-based catalyst and a solvent to produce a coated product, and then drying the coated product, the mixture solution further containing an oxidant; and
performing vapor-phase polymerization by contacting the substrate with monomers that make up a conductive polymer in a vapor phase, the oxidant including a material selected from a group consisting of $AuCl_3$, $MgCl_2$, $H_2PtCl_6 \cdot 6H_2O$, $(HAuCl_4 \cdot H_2O)AgNO_3$, $Na_2PdCl_4$, and $NiCl_2$, the conductive layer containing nano composite particles which contain a conductive polymer obtained by vapor-phase polymerization and metal which acts as the oxidant during polymerization.

* * * * *